United States Patent
Seo et al.

(10) Patent No.: US 10,365,427 B2
(45) Date of Patent: Jul. 30, 2019

(54) BACK LIGHT UNIT AND DISPLAY DEVICE

(71) Applicant: LG Display Co., Ltd., Seoul (KR)

(72) Inventors: Jeongho Seo, Paju-si (KR); SangMook Lee, Paju-si (KR); YongYun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 71 days.

(21) Appl. No.: 15/349,951

(22) Filed: Nov. 11, 2016

(65) Prior Publication Data

US 2017/0192159 A1    Jul. 6, 2017

(30) Foreign Application Priority Data

Dec. 31, 2015 (KR) .................. 10-2015-0191337

(51) Int. Cl.
| | |
|---|---|
| *F21V 7/04* | (2006.01) |
| *F21V 8/00* | (2006.01) |
| *H05K 1/18* | (2006.01) |
| *H05K 3/00* | (2006.01) |
| *H05K 3/44* | (2006.01) |
| *H05K 1/05* | (2006.01) |
| *H05K 3/28* | (2006.01) |

(52) U.S. Cl.
CPC ......... *G02B 6/0083* (2013.01); *G02B 6/0031* (2013.01); *G02B 6/0068* (2013.01); *H05K 1/056* (2013.01); *H05K 1/183* (2013.01); *H05K 3/0014* (2013.01); *H05K 3/44* (2013.01); *H05K 3/284* (2013.01); *H05K 3/287* (2013.01); *H05K 2201/10106* (2013.01)

(58) Field of Classification Search
CPC .. G02B 6/0068; G02B 6/0073; G02B 6/0081; G02B 6/0023; G02B 6/0091; G02B 6/0031; G02B 6/009; G02B 6/0083; G02B 6/0085; G02B 6/0086; G02B 6/0088; F21V 7/005; F21V 7/0058
See application file for complete search history.

(56) References Cited

U.S. PATENT DOCUMENTS

| | | | |
|---|---|---|---|
| 2006/0262554 A1* | 11/2006 | Mok | G02B 6/0031 362/555 |
| 2011/0025942 A1* | 2/2011 | Lee | G02F 1/133615 349/58 |
| 2012/0262643 A1* | 10/2012 | Kweon | G02B 6/0091 349/58 |

(Continued)

FOREIGN PATENT DOCUMENTS

| | | |
|---|---|---|
| TW | M406752 U | 7/2011 |
| TW | M413882 | 10/2011 |
| TW | I507791 B | 11/2015 |

OTHER PUBLICATIONS

Taiwan First Office Action, Taiwan Application No. 105142958, dated Oct. 23, 2017, 23 pages.

(Continued)

*Primary Examiner* — Matthew J. Peerce
(74) *Attorney, Agent, or Firm* — Fenwick & West LLP

(57) ABSTRACT

There is provided a back light unit including a light source module and a light source mounting board in which at least one groove is indented deeper than a thickness of the light source module and the light source modules are disposed within the groove.

22 Claims, 19 Drawing Sheets

(56) References Cited

U.S. PATENT DOCUMENTS

| | | | | |
|---|---|---|---|---|
| 2015/0062494 A1* | 3/2015 | Park | ............... | G02B 6/0068 |
| | | | | 349/65 |
| 2015/0168629 A1* | 6/2015 | Yu | ............... | G02B 6/0031 |
| | | | | 362/609 |
| 2016/0308101 A1* | 10/2016 | Konishi | ............... | H01L 33/60 |

OTHER PUBLICATIONS

Taiwan Second Office Action, Taiwan Application No. 105142958, dated Feb. 12, 2018, 19 pages.

\* cited by examiner

BACK LIGHT UNIT AND DISPLAY DEVICE

CROSS-REFERENCE TO RELATED APPLICATION

This application claims priority from and the benefit under 35 U.S.C. § 119(a) of Republic of Korea Patent Application No. 10-2015-0191337 filed on Dec. 31, 2015, which is hereby incorporated by reference for all purposes as if fully set forth herein.

BACKGROUND

Field of the Invention

The present disclosure relates to a back light unit and a display device.

Description of the Related Art

With the progress of the information-oriented society, various demands for display devices for displaying an image are increasing. Recently, various kinds of display devices such as a liquid crystal display (LCD) device, a plasma display panel (PDP) device, an organic light emitting diode (OLED) display device, etc. have been used.

Of the above-described display devices, an LCD device includes an array board including a thin film transistor as a switching element for ON/OFF control of each pixel domain, an upper substrate including a color filter and/or a black matrix, a display panel including a liquid crystal layer and formed therebetween, a driver configured to control the thin film transistor, a back light unit (BLU) configured to provide a light to the display panel, etc. In the LCD device, alignment of the liquid crystals in the liquid crystal layer is adjusted depending on an electric field applied between a pixel (PXL) electrode and a common voltage (Vcom) electrode provided in the pixel domain, so that the light transmittance is adjusted and an image is displayed.

Such an LCD device needs a back light unit configured to provide a light from the outside. The back light unit includes a light source device, a light guide panel, a reflector, a cover bottom, etc.

A conventional light source device has a structure in which a plurality of light source packages is disposed on a light source mounting board. In this structure, the light source packages are positioned adjacent to a light guide panel. Herein, in order to suppress damage to the light source packages caused by thermal expansion of the light guide panel, the conventional light source device includes an attenuator, such as a T-pad, positioned between the light source packages.

Such a T-pad limits a region where the light source packages can be disposed, and, thus, limits the total quantity of light of the back light unit to a certain extent.

Further, the T-pad may cause a certain optical gap between the light source packages and the light guide panel, so that the efficiency of light transferred from the light source to the light guide panel may be decreased.

SUMMARY

Embodiments provide a light source structure in which a conventional attenuator, such as a T-pad, is eliminated. Another aspect of the present disclosure provides a technology of improving the design freedom in disposing a light source and thus increasing the quantity of light of a back light unit if necessary. Further, yet another aspect of the present disclosure provides a technology of reducing the leakage quantity of light output from a light source through a gap. Still another aspect of the present disclosure provides a technology of reducing a thickness of a light source device including a light source and a light source mounting board and thus reducing a thickness of a bezel in a display device.

Embodiments relate to a display apparatus including a display panel, a light guide panel, and a light source device. The light source device includes a mounting board having one or more walls defining a groove, and one or more light source modules disposed inside the groove and having a thickness smaller than the depth of the groove.

As described above, according to the present disclosure, the number of light sources can be increased, and thus, the total light quantity of a backlight unit can be increased. Further, according to the present disclosure, the leakage quantity of light output from a light source can be reduced, and thus, the light efficiency can be increased. Furthermore, according to the present disclosure, by eliminating a conventional attenuator, such as a T-pad, costs can be reduced. Moreover, according to the present disclosure, since a light source package having a certain volume is not used, the light source can be freely disposed. Also, according to the present disclosure, since a thickness of a light source device is smaller than that of a conventional light source package and a light source mounting board, a thickness of a bezel can be reduced.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1:
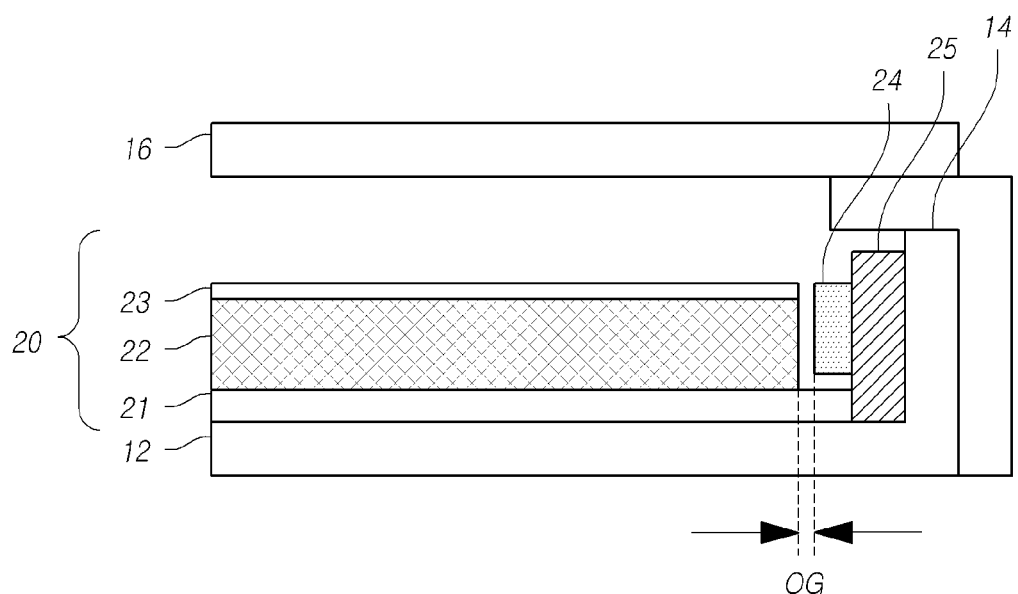
FIG. 1 is a configuration view of a general display device.

Hereinafter, some exemplary embodiments will be described in detail with reference to the accompanying drawings. In adding reference numerals to components throughout the drawings, it is to be noted that like reference numerals designate like components even though components are shown in different drawings. Further, in explaining the exemplary embodiments, a detailed explanation of well-known components or functions may be omitted to avoid unnecessarily obscuring the subject matter of the present disclosure.

Further, in describing components of the present invention, terms such as first, second, A, B, (a), (b), etc., can be used. These terms are used only to differentiate the components from other components. Therefore, the nature, order, sequence, etc., of the corresponding components are not limited by these terms. It is to be understood that when one element is referred to as being "connected to" or "coupled to" another element, it may be connected directly to or coupled directly to the other element or be connected to or coupled to the other element having a third element intervening therebetween. In the same context, it is to be understood that when one element is referred to as being "on" or "below" another element, it may be directly coupled "on" or "below" the other element or be connected "on" or "below" the other element or may be indirectly coupled "on" or "below" the other element or be connected "on" or "below" the other element having a third element intervening therebetween.

FIG. 1 is a configuration view of a general display device.

Referring to FIG. 1, a display device 10 includes a display panel 16 such as a liquid crystal display panel, and a back light unit 20 disposed under the display panel 16 and configured to irradiate a light to the display panel 16. Further, the display device 10 includes a cover bottom 12 configured to support the back light unit, extended throughout a back surface of the display device 10, and formed of metal or plastic. Furthermore, the display device 10 includes a guide panel 14 configured to support the display panel 16.

The back light unit 20 may be classified into an edge-type back light unit or a direct-type back light unit depending on alignment of a light source and a light transfer method.

In the edge-type back light unit 20, a light source package 24 including a light source such as a light emitting diode (LED), and a light source mounting board 25 including a holder or a housing for fixing the light source, a light source driver circuit, etc. are disposed on one side of the display device 10 as illustrated in FIG. 1. Further, the back light unit 20 includes a light guide panel 22 configured to diffuse a light to the entire region of the display panel 16, a reflector 21 configured to reflect a light toward the display panel 16, and an optical sheet 23 disposed on the light guide panel 22 and provided to improve brightness and diffuse and protect a light.

In the edge-type back light unit 20, alight output from the light source is incident into an inlet portion of the light guide panel 22 and then diffused to the entire surface of the display device 10 as being total-reflected at the light guide panel 22.

The direct-type back light unit is another type of the back light unit. The direct-type back light unit includes a light source mounting board disposed on a cover bottom and a diffusion panel disposed with a predetermined separation distance from the light source mounting board and configured to diffuse a light output from a light source. Further, the direct-type back light unit includes an optical sheet disposed on the diffusion panel. In the direct-type back light unit, the light source mounting board is disposed on the entire surface of the display device and a plurality of light source packages and a light diffusion lens configured to diffuse a light output from each light source package are disposed on the light source mounting board.

In the conventional back light unit 20, the light source package 24 is attached on the light source mounting board 25 as illustrated in FIG. 1. Further, in order to reduce damage to the light source package 25 caused by contraction and expansion of the light guide panel 22, a certain optical gap (OG) is formed between the light guide panel 22 and the light source package 24. The gap OG is formed by a T-pad additionally disposed on the light source mounting board 25.

Figure 2:
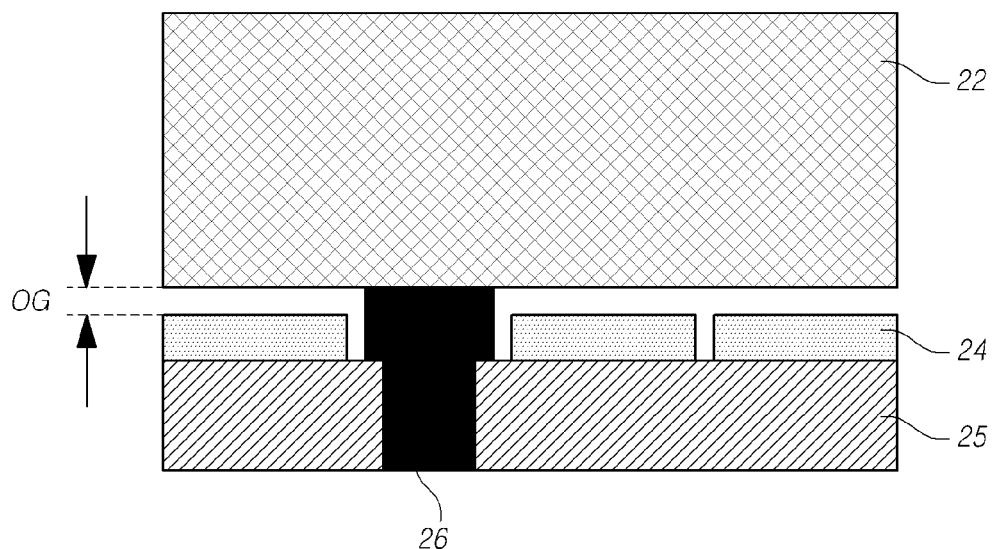
FIG. 2 is a diagram illustrating an optical gap formed by a T-pad.

FIG. 2 is a diagram illustrating an optical gap formed by a T-pad.

Referring to FIG. 2, a plurality of the light source packages 24 is disposed on the light source mounting board 25, and a T-pad 26 is disposed between the light source packages 24.

The T-pad 26 forms a certain optical gap OG between the light guide panel 22 and the light source package 24 while supporting one lateral surface of the light guide panel 22.

Some of the light outputted from the light source packages 24 is leaked due to the OG, and thus, the light efficiency is decreased. Further, a region where the light source mounting board 25, the light source packages 24, and the optical gap OG are positioned is a bezel region where an image is not displayed. Therefore, with the above-described structure, a thickness of a bezel of the display device 10 may be increased.

Further, the light source packages 24 cannot be disposed in a region where the T-pad 26 is positioned. Therefore, the total amount of light of the back light unit 20 may be decreased.

Figure 3:
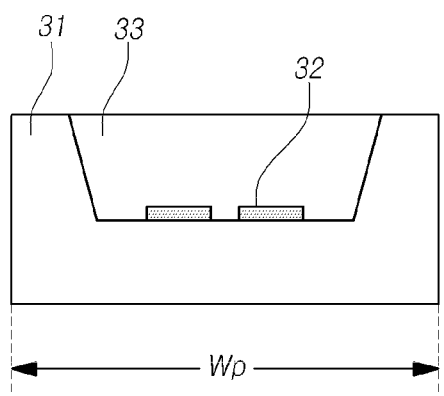
FIG. 3 is a cross-sectional view of the light source package illustrated in FIG. 1 and FIG. 2.

FIG. 3 is a cross-sectional view of the light source package illustrated in FIG. 1 and FIG. 2.

Referring to FIG. 3, the light source package 24 includes light source chips 32, a phosphor 33, and a mold 31.

The mold 31 surrounds the light source chips 32 and the phosphor 33, and thus, has a predetermined width Wp. The number of light sources which can be disposed on the light source mounting board 25 is determined by the width Wp of the mold 31. It is necessary for a designer to dispose a light source depending on the width Wp of the mold 31 rather than a size of the light source. Therefore, with the above-described structure, the design freedom may be decreased.

Further, since the mold 31 has a predetermined size, the number of light sources which can be disposed on the light source mounting board 25 may be limited. In order to increase the amount of light of the back light unit, the number of light sources may be increased. However, the number of light sources is limited to the size of the mold 31.

Figure 4:
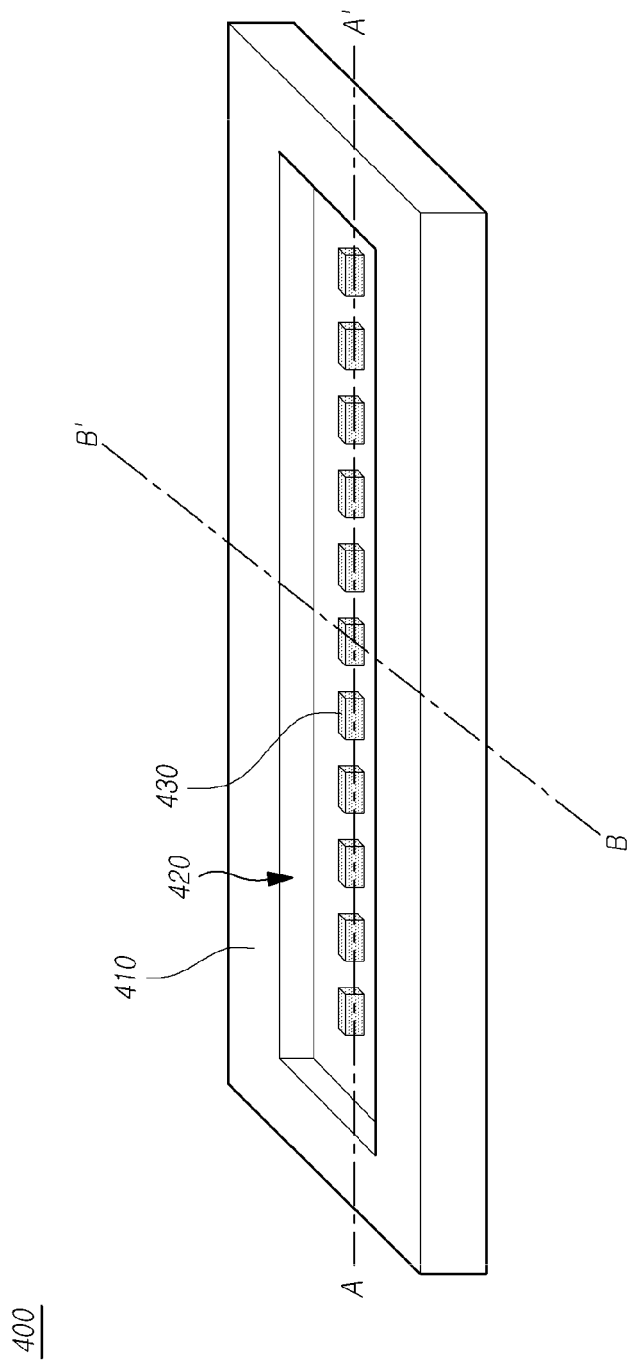
FIG. 4 is a perspective view of a light source device according to an exemplary embodiment.

FIG. 4 is a perspective view of a light source device according to an exemplary embodiment.

Referring to FIG. 4, a light source device 400 may include a light source mounting board 410 and a light source module 430.

At least one groove 420 is indented inwards at a side of the light source mounting board 410. The groove 420 may be indented deeper than a thickness of the light source module 430.

The light source mounting board 410 may be a metal mounting board in which an insulation layer is positioned on a metal plate and a conducting wire is disposed on the insulation layer. In the metal mounting board, the groove 420 may be formed by a press process.

The light source module 430 may be disposed within the groove 420. As illustrated in FIG. 4, a plurality of the light source modules 430 may be disposed in a row, or may be disposed in two or more rows.

Figure 5:
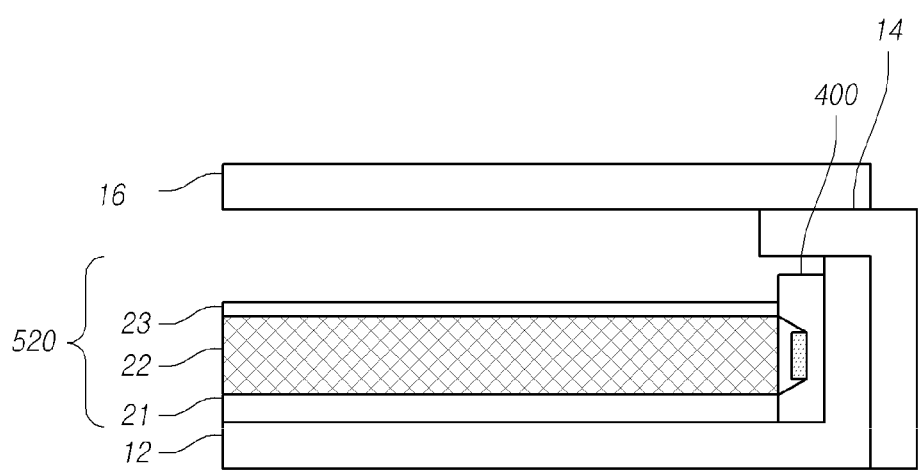
FIG. 5 is a configuration view of a display device according to an exemplary embodiment.

FIG. 5 is a configuration view of a display device according to an exemplary embodiment.

Referring to FIG. 5, a display device 500 may include the cover bottom 12, the guide panel 14, the display panel 16, and a back light unit 520.

In the back light unit 520, the light source device 400 described with reference to FIG. 4, as well as the reflector 21, the light guide panel 22, and the optical sheet 23 may be disposed in the back light unit 520.

Figure 6:
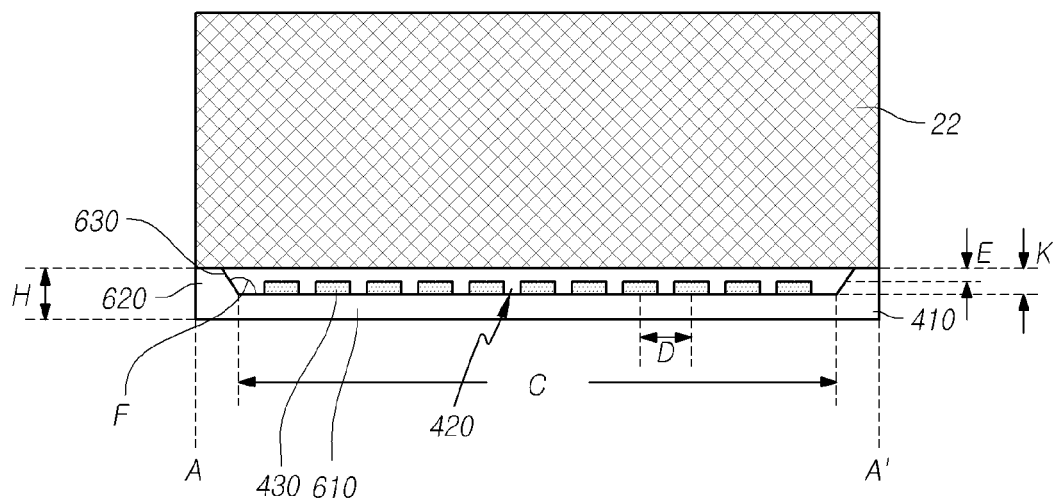
FIG. 6 is a cross-sectional view of a light source device and a light guide panel taken along a line A-A' of FIG. 4.

FIG. 6 is a cross-sectional view of a light source device and a light guide panel taken along a line A-A' of FIG. 4.

Referring to FIG. 6, the groove 420 may be formed on the light source mounting board 410 so as to face the light guide panel 22.

On a bottom portion 610 of the groove 420, a plurality of the light source modules 430 may be disposed. A length C of the groove 420 along which the mounting board 410 extends may vary depending on a design. In one embodiment, all light source modules 430 are placed in a single groove 420. In other embodiments, a subset of light source modules 430 are placed in one of multiple grooves 1420, as described below in detail with respect to FIG. 14.

The light source modules 430 may be disposed with a predetermined distance D from each other. If the light source modules 430 are disposed with a predetermined distance from each other, a light incident into the light guide panel 22 becomes more uniform and the brightness of the entire region of the display device 500 can be controlled more uniformly.

An outer periphery 620 of the groove 420 may be in contact with one lateral surface of the light guide panel 22.

The outer periphery 620 may support the one lateral surface of the light guide panel 22 while being in contact with the light guide panel 22. The outer periphery 620 serves as a T-pad of the prior art.

The outer periphery 620 suppresses leakage of a light output from the light source modules 430 while being in contact with the light guide panel 22. The outer periphery 620 is positioned on all edges of the light source mounting board 410 in a plane view. Accordingly, the outer periphery 610 performs a function of suppressing leakage of the light source modules 430 to the outside in all directions.

A height of the outer periphery 620 or a depth K of the groove 420 may be greater than a thickness of the light source module 430. Therefore, a gap E is formed between the light source module 410 and the light guide panel 22. The light guide panel 22 may expand due to heat radiated from the light source module 410. The gap E reduces the likelihood of damaging the light source module 410 caused by expansion of the light guide panel 22.

Although the gap E is formed between the light source module 410 and the light guide panel 22, the light source module 410 is surrounded by the outer periphery 620 and the outer periphery 620 is in contact with the light guide panel 22. Therefore, a light is not leaked to the outside of the light source mounting board 410.

A lateral surface 630 of the groove 420 may be inclined at a predetermined angle F or more. The groove 420 of the light source mounting board 410 may be formed by a press process. Herein, in order to reduce the likelihood of a disconnection of the conducting wire formed on the light source mounting board 410 during a press process, the lateral surface 630 of the groove 420 may be inclined at the predetermined angle F. To be specific, a conducting wire for supplying power to the light source modules 430 may be disposed on the lateral surface 630 of the groove 420. In order to reduce the likelihood of a disconnection of the conducting wire during a press process, the lateral surface 630 of the groove 420 may be designed to be inclined at the predetermined angle F.

Figure 7:
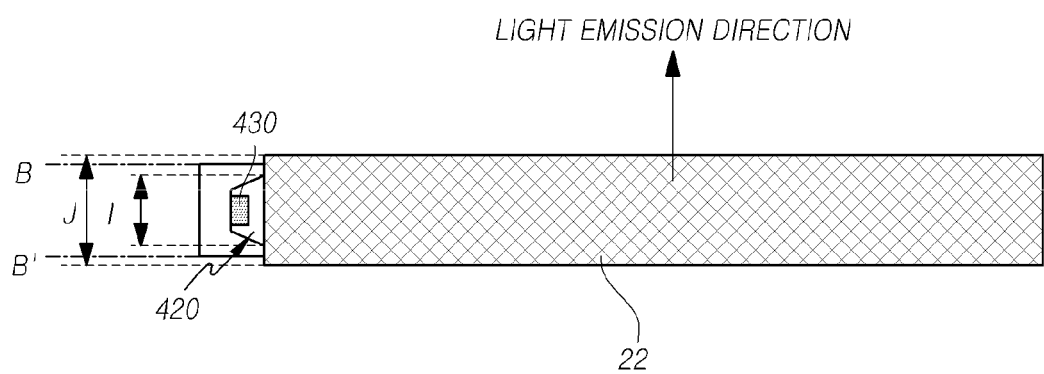
FIG. 7 is a cross-sectional view of a light source device and a light guide panel taken along a line B-B' of FIG. 4.

FIG. 7 is a cross-sectional view of a light source device and a light guide panel taken along a line B-B' of FIG. 4.

Referring to FIG. 7, a thickness J of the light guide panel 22 with respect to a light emission direction is greater than a width I of the groove 420. If the width I of the groove 420 with respect to the light emission direction is greater than the thickness J of the light guide panel 22, a light output from the light source module 430 may be leaked to the outside of the light guide panel 22.

Figure 8:
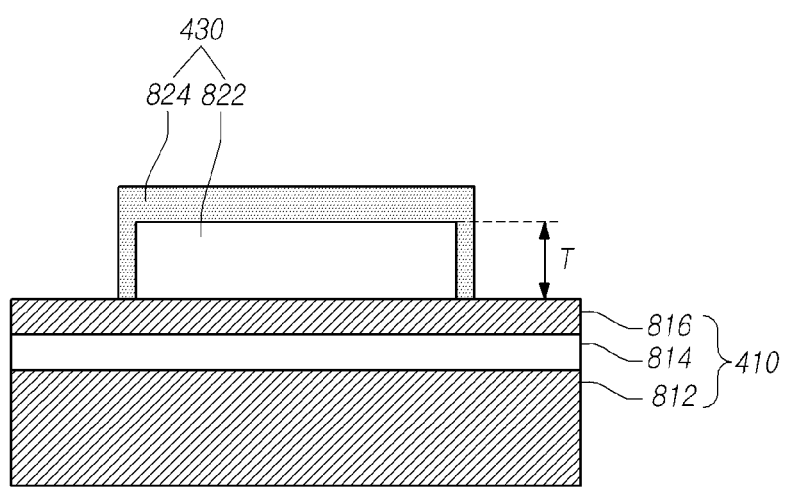
FIG. 8 is a cross-sectional view of a light source module and a light source mounting board according to an exemplary embodiment.

FIG. 8 is a cross-sectional view of a light source module and a light source mounting board according to an exemplary embodiment.

Referring to FIG. 8, a metal layer 812 may be positioned at a lower end of the light source mounting board 410. The metal layer 812 may be an aluminum layer. Otherwise, the metal layer 812 may be formed of any one of silicon steel, galvanized steel, copper alloys, and nickel.

If the metal layer 812 is compressed by a press process, a groove may be formed in the metal layer 812.

The metal layer 812 also performs a function of dissipating heat of the light source module 430. Since the metal layer 812 has a high thermal conductivity, the metal layer 812 has the advantage of transferring heat generated from the light source module 430 to the outside.

An insulation layer 814 may be positioned on the metal layer 812, and a conducting wire layer 816 may be positioned on the insulation layer 814. The insulation layer 814 may be formed of epoxy, and the conducting wire layer 816 may be formed of copper.

The insulation layer 814 electrically insulates the conducting wire layer 816 from the metal layer 812. Further, the insulation layer 814 also performs a function of fixing a conducting wire to the light source mounting board 410.

On the conducting wire layer 816, a conducting wire for supplying power to the light source module 430 is disposed.

Referring to FIG. 8, the light source module 430 may include a light source chip 822 having a thickness T and a phosphor 824. In one embodiment, the light source chip 822 is directly connected to a conducting wire of the light source module 430. In another embodiment, a lower surface of the light source chip is in contact with a conducting wire of the light source module 430.

The light source chip 822 may be a blue LED. Further, the phosphor 824 may perform a function of converting a blue light output from the light source chip 822 into a white light.

The light source chip 822 may be a white LED. However, as described above, the light source chip 822 may be a blue LED and the phosphor 824 may include a light conversion material that converts a blue light into a red (R) or green (G) light.

The phosphor 824 may surround the light source chip 822. A light may be output in all directions from the light source chip 822. Since the phosphor 824 surrounds all surfaces of the light source chip 822 except a bottom surface of the light source chip 822, the phosphor 824 converts a light output from the light source chip 822 into a white light. In some exemplary embodiments, the phosphor 824 may surround the entire outer periphery of the light source chip 822 including the bottom surface thereof.

The light source module 430 does not include a mold unlike a conventional light source package. Therefore, the light source module 430 has a smaller area and a smaller height than the light source package. Accordingly, the light source module 430 can be easily disposed and the light source modules 430 greater in number than the light source packages can be disposed on the light source mounting board.

Figure 9:
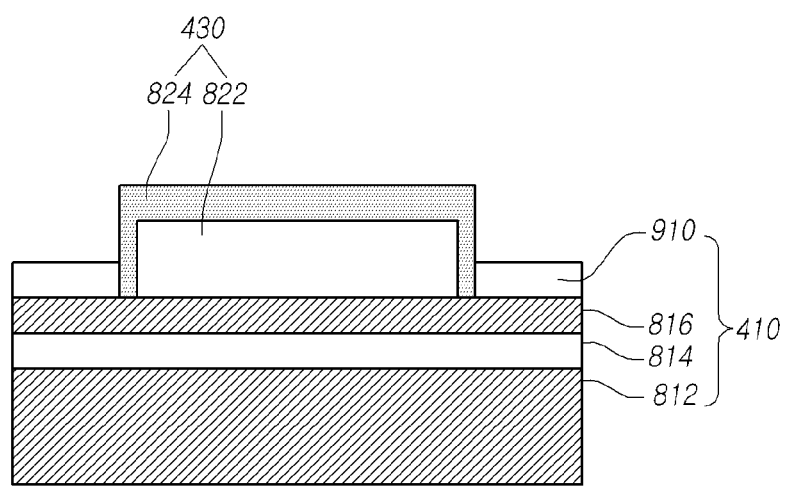
FIG. 9 is a diagram illustrating that a reflective layer is further formed on a light source mounting board.

FIG. 9 is a diagram illustrating that a reflective layer is further formed on a light source mounting board.

Referring to FIG. 9, a reflective layer 910 may be further positioned on the conducting wire layer 816. The reflective layer 910 may be formed of a metal, such as silver or tin, having a high reflectance.

On an inner lateral surface of the groove, the reflective layer 910 may be positioned in a region where the light source modules 430 are not positioned. Since the reflective layer 910 is formed on the inner lateral surface of the groove, a light toward the bottom of the groove may be reflected and outputted in a direction to the light guide panel 22.

The light source device 400 described with reference to FIG. 4 through FIG. 9 may include one surface facing one lateral surface of the light guide panel 22 and the other surface in contact with a side wall of the cover bottom 12. With this alignment, a light output from the light source device 400 is directly transferred to an incident surface of the light guide panel 22, and heat generated from the light source device 400 may be transferred to the outside through the side wall of the cover bottom 12.

The side wall of the cover bottom 12 has a smaller area than the bottom of the cover bottom 12. Therefore, in the above-described layout of the light source device 400, the heat dissipation efficiency is low. In order to increase the heat radiation efficiency, a dissipation element such as a dissipation pad may be additionally used. However, in this case, costs may be increased. If a high-current light source chip is used, heat generation is increased. Therefore, such a heat dissipation problem may be magnified.

In order to improve heat dissipation, the light source device 400 may be attached to the bottom of the cover bottom 12 rather than the side wall of the cover bottom 12.

Figure 10:
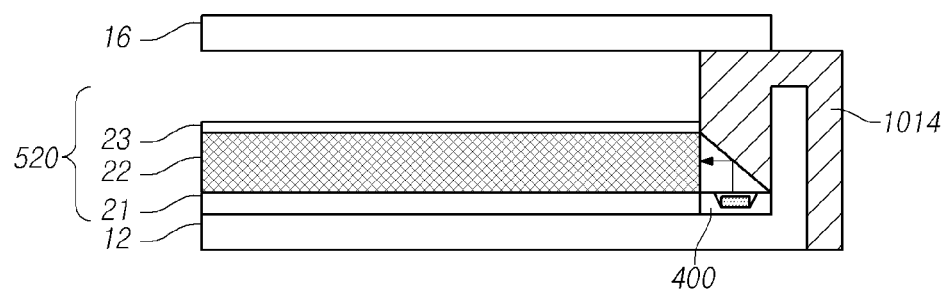
FIG. 10 is a configuration view of a display device in which a light source device is positioned in contact with a bottom of a cover bottom.

FIG. 10 is a configuration view of a display device in which a light source device is positioned in contact with a bottom of a cover bottom.

Referring to FIG. 10, the light source device 400 may be positioned in contact with the bottom of the cover bottom 12. To be specific, the groove 420 of the light source mounting board 410 and the light source module 430 may be disposed in a direction facing the display panel 16. Accordingly, a light is output from the light source module 430 in a direction toward the display panel 16.

A lateral surface opposite to the light emission direction of the light source mounting board 410 may be in contact with a bottom side of the cover bottom 12. With this structure, heat transferred through the light source mounting board 410 may be transferred to the outside through the bottom side of the cover bottom 12.

Since the light source module 430 does not output a light in a direction toward the incident surface of the light guide panel 22, a display device 1000 may further include an optical path changing structure configured to change a path of a light output from the light source module 430 to the direction toward the incident surface of the light guide panel 22.

Figure 11:
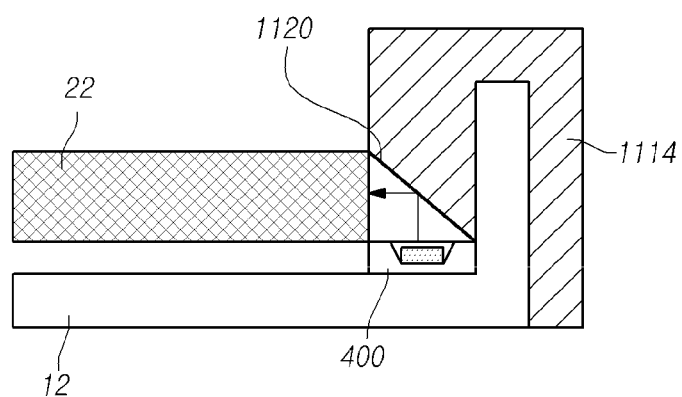
FIGS. 11 through 13 are diagrams illustrating examples of an optical path changing structure.
Figure 12:
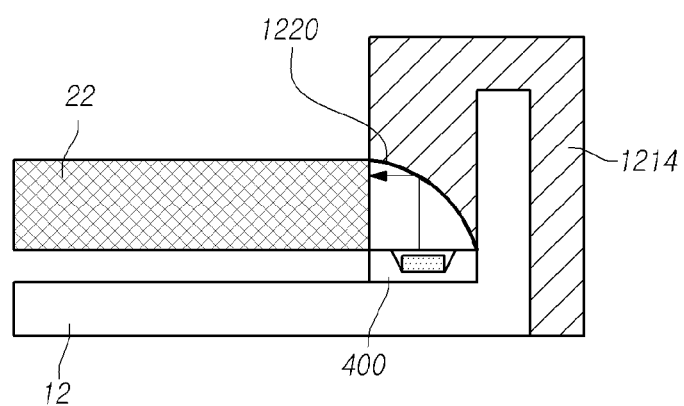
Figure 13:
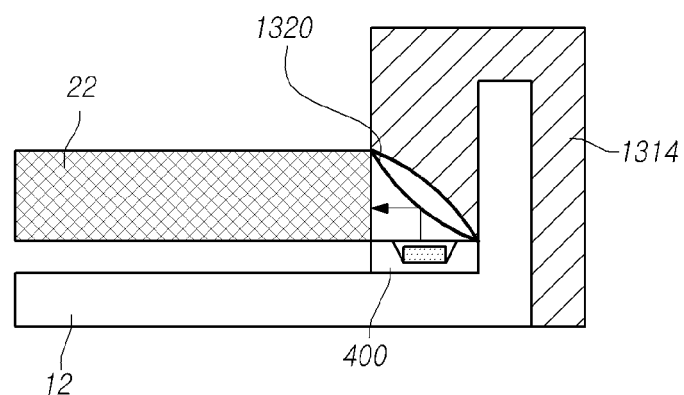

FIGS. 11 through 13 are diagrams illustrating examples of an optical path changing structure.

Referring to FIGS. 11 through 13, a guide panel may have a "⌐" or "C" shape covering the side wall of the cover bottom 12. Herein, in the guide panel, the optical path changing structure may be positioned on a surface facing the light source device 400 and the light guide panel 22.

Referring to FIG. 11, as a specific example, one surface of a guide panel 1114 may be inclined with respect to the light emission direction of the light source device 400 and a reflective mirror 1120 may be positioned on the surface. A light output from the light source device 400 may be reflected at the reflective mirror 1120 and then transferred to the incident surface of the light guide panel 22.

Referring to FIG. 12, one surface of a guide panel 1214 may be formed into a curved surface and a reflective mirror 1220 having a curved surface shape may be positioned on the surface. A light output from the light source device 400 may be reflected at the reflective mirror 1220 having a curved surface shape and then transferred to the incident surface of the light guide panel 22.

Referring to FIG. 13, a reflective lens 1320 may be positioned on one surface of a guide panel 1314, and a light output from the light source device 400 may be changed in path by the reflective lens 1320 and then transferred to the incident surface of the light guide panel 22.

In the examples illustrated in FIGS. 11 through 13, the angle between the light emission direction of the light source module and a light incident direction of the light guide panel 22 is 90 degrees. In other embodiments, the angle between the light emission direction of the light source module and the light incident direction of the light guide panel 22 may be less than 90 degrees.

If the angle between the light emission direction of the light source module and the light incident direction of the light guide panel 22 is 90 degrees, a light output from the light source module primarily proceeds toward the display panel 16. Herein, if the output light is not reflected by the optical path changing structure and some of the output light is leaked, the leaked light may be visible on the display panel 16.

In order to reduce the visibility of the leaked light, the angle between the light emission direction of the light source module and the light incident direction of the light guide panel 22 may be set to be less than 90 degrees. In this case, the light output from the light source module may proceed toward the display panel 16 in an inclined direction, and, thus, the visibility of the leaked light is reduced.

Although the display device in which one groove is formed on a light source mounting board has been described in the above-described exemplary embodiments, two or more grooves may be formed on the light source mounting board.

Figure 14:
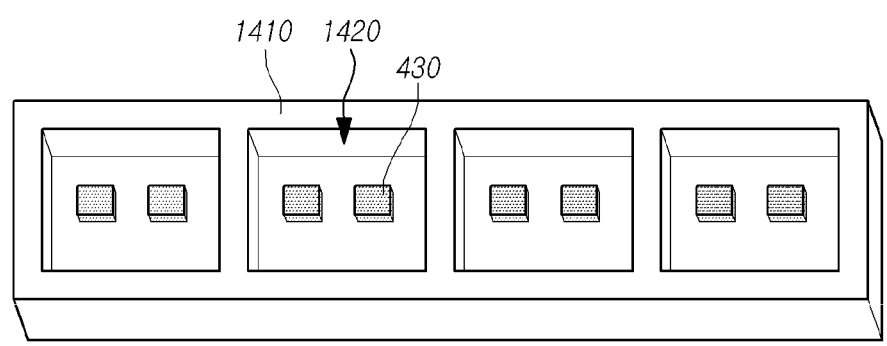
FIG. 14 is a diagram illustrating a light source mounting board in which two or more grooves are formed.

FIG. 14 is a diagram illustrating a light source mounting board in which two or more grooves are formed.

Referring to FIG. 14, two or more grooves 1420 may be formed on a light source mounting board 1410. Further, at least one light source module 430 may be positioned within each of the grooves 1420.

If a single groove is not formed by reason of the process, two or more grooves 1420 may be formed on the light source mounting board 1410 as illustrated in FIG. 14.

If two or more grooves 1420 are formed, a contact area of the light source mounting board 1410 with the light guide panel 22 may be increased, and, thus, the light guide panel 22 may be supported more stably.

Shapes, alignment, and the number of grooves and light source modules positioned on the light source mounting board can be modified in various manners.

Figure 15:
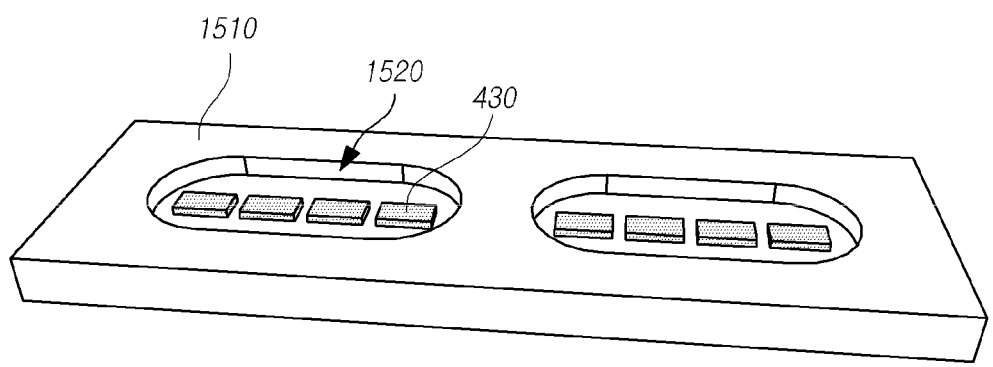
FIG. 15 is a diagram illustrating a light source device in which a round edge-shaped groove is formed.

FIG. 15 is a diagram illustrating a light source device in which a round edge-shaped groove is formed.

Referring to FIG. 15, a light source device 1500 includes a light source mounting board 1510 and a plurality of the light source modules 430.

Further, a plurality of grooves 1520 may be positioned in the light source mounting board 1510.

The groove 1520 may be formed into various shapes. In the exemplary embodiment illustrated in FIG. 15, two grooves 1520 having a round edge are formed in the light source mounting board 1510.

The groove 1520 may be lengthily formed in a first direction (e.g., a transverse direction in FIG. 15). Herein, both side edges in the first direction may have a round shape. If the edges have a rectangular shape, a conducting wire disposed around a vertex where two edges intersect with each other can be disconnected during a press process. On the other hand, if the edges are formed into a round shape, a vertex is actually not formed, and, thus, the above-described problem can be alleviated.

Referring to FIG. 15, two grooves 1520 are positioned in the light source mounting board 1510, and a plurality of the light source modules 430 is disposed within each of the grooves 1520. If the grooves 1520 are positioned to be separate from each other as such, a border between the grooves 1520 may function as a supporting structure for supporting a light guide panel.

The grooves may be formed at a central portion of the light source mounting board, or may be formed on only one side of the light source mounting board.

Figure 16:
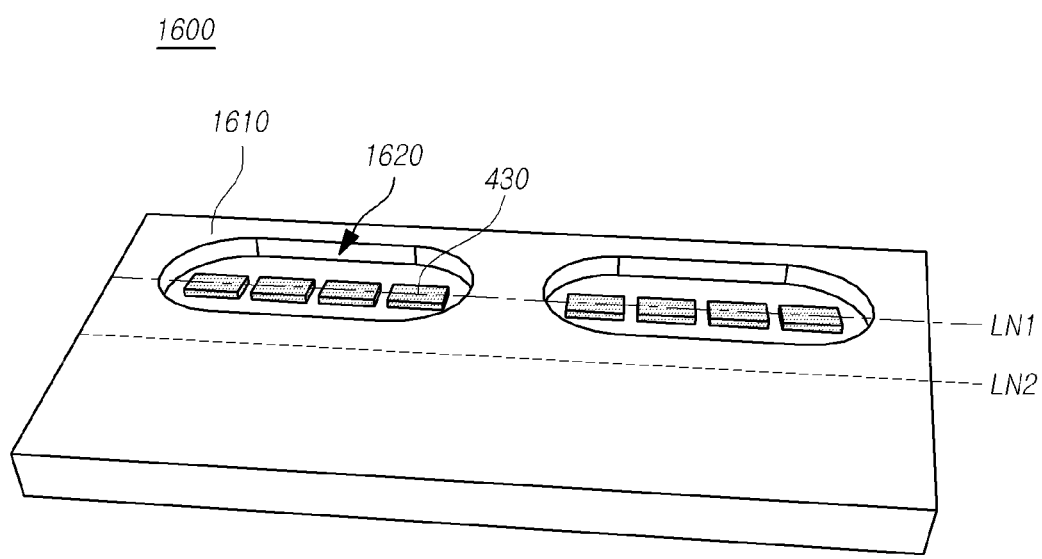
FIG. 16 is a diagram illustrating a light source device in which a groove is formed to be one-sided with respect to a central line.

FIG. 16 is a diagram illustrating a light source device in which a groove is formed to be one-sided with respect to a central line.

Referring to FIG. 16, a light source device 1600 may include a light source mounting board 1610 and a plurality of the light source modules 430, and a plurality of grooves 1620 may be formed in the light source mounting board 1610.

A central line LN1 of the grooves 1620 may be one-sided with respect to a central line NL2 of the light source mounting board 1610.

Herein, positions of the grooves 1620 may be determined depending on a position of a light inlet portion of a light guide panel. Further, the other region of the light source mounting board 1610 where the grooves 1620 are not positioned may be used for expanding a heat dissipation function.

The light source modules positioned within the groove may be disposed in two rows.

Figure 17:
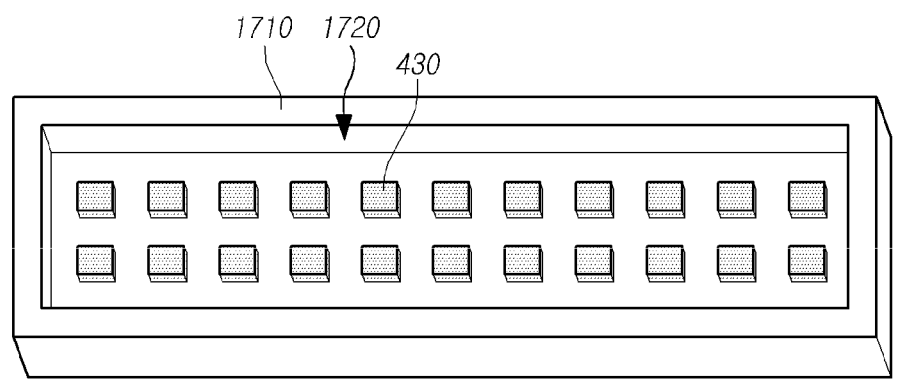
FIG. 17 is a diagram illustrating a light source device in which light source modules are disposed in two or more rows within a groove.

FIG. 17 is a diagram illustrating a light source device in which light source modules are disposed in two or more rows within a groove.

Referring to FIG. 17, a light source device 1700 may include a light source mounting board 1710 and the light source module 430, and a groove 1720 may be formed in the light source mounting board 1710.

A plurality of the light source modules 430 may be disposed within the groove 1720. The plurality of the light source modules 430 may be disposed in two or more rows.

If the light source modules 430 are disposed in two or more rows, the total amount of light may be increased.

The plurality of the light source modules 430 may be disposed in two or more rows within one groove as illustrated in FIG. 17. Otherwise, a plurality of grooves may be disposed in two or more rows and the plurality of the light source modules 430 may be disposed in a row within each of the grooves.

Figure 18:
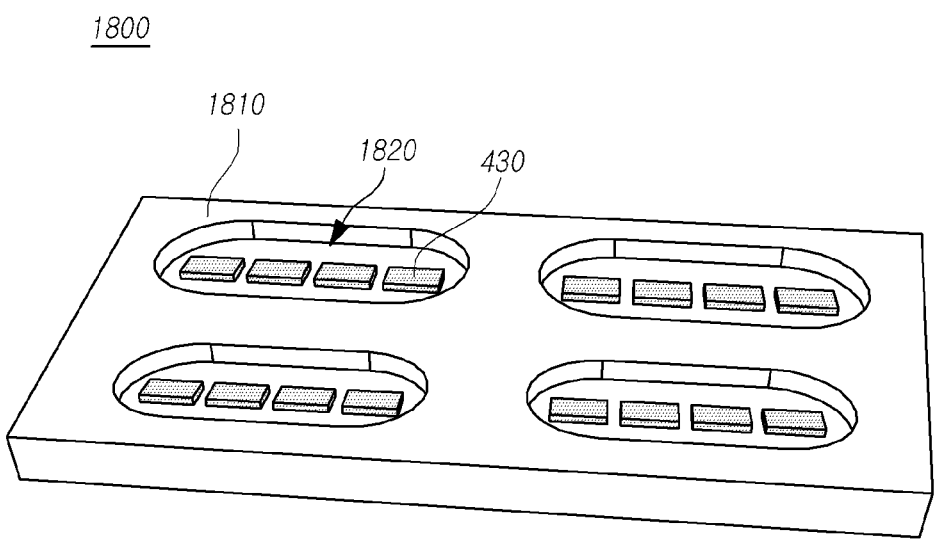
FIG. 18 is a diagram illustrating a light source device in which grooves are formed in two or more rows.

FIG. 18 is a diagram illustrating a light source device in which grooves are formed in two or more rows.

Referring to FIG. 18, a light source device 1800 may include a light source mounting board 1810 and the light source module 430, and a plurality of grooves 1820 may be formed in two or more rows in the light source mounting board 1810.

A plurality of the light source modules 430 may be disposed in a row within one groove 1820.

Further, the grooves 1820 may be formed in two or more rows in the light source mounting board 1810.

In this structure, a border between the grooves 1820 may function as a supporting structure for supporting a light guide panel. Further, since the number of the disposed light source modules 430 is increased, the total light quantity may be increased.

Although the light source modules 430 have been described as being disposed with a predetermined distance from each other in the above-described exemplary embodiments, a distance between the light source modules 430 or alignment of the light source modules 430 may be varied.

Figure 19:
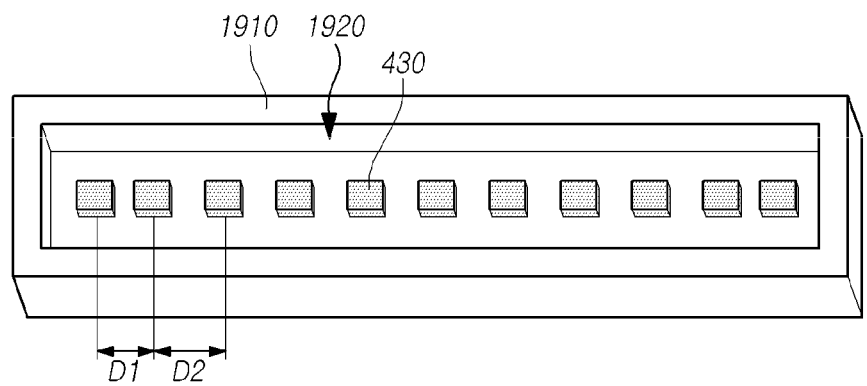
FIG. 19 is a diagram illustrating a light source device in which light source modules are narrowly disposed at both ends.

FIG. 19 is a diagram illustrating a light source device in which light source modules are narrowly disposed at both ends.

Referring to FIG. 19, a light source device 1900 may include a light source mounting board 1910 and the light source module 430, and a groove 1920 may be formed in the light source mounting board 1910.

A plurality of the light source modules 430 is disposed within the groove 1920. A distance D1 between the light source modules 430 at both ends may be smaller than a distance D2 at a central portion.

The present exemplary embodiment may be highly useful to increase a light quantity at an edge of a panel.

According to the exemplary embodiments, the number of light sources in a display device can be increased, and thus, the total light quantity of a back light unit can be increased. Further, according to the exemplary embodiments, the leakage quantity of light output from a light source can be reduced, and thus, the light efficiency can be increased. Furthermore, according to the exemplary embodiments, by eliminating a conventional attenuator, such as a T-pad, costs can be reduced. Moreover, according to the exemplary embodiments, since a light source package having a certain volume is not used, the light source can be freely disposed. Also, according to the exemplary embodiments, since a thickness of a light source device is smaller than that of a conventional light source package and a light source mounting board, a thickness of a bezel can be reduced.

The term "comprises", "includes" or "has" and/or "comprising", "including" or "having" used in the document means that one or more other components, steps, operation and/or existence or addition of elements are not excluded in addition to the described components, steps, operation and/or elements unless context dictates otherwise and is not intended to preclude the possibility that one or more other features, numbers, steps, operations, components, parts, or combinations thereof may exist or may be added. All terms including technical and scientific terms used in the present invention are in effect equivalent to terms generally understood by those skilled in the art unless they are defined otherwise. Terms defined in a generally used dictionary shall be construed as having meanings equivalent to contextual meanings used in the art, but shall not be construed as having ideal or excessively forming meanings unless they are clearly defined in the present invention.

The above descriptions are provided only for illustration of the technical concept of the present invention, and it would be understood by those skilled in the art that various changes and modifications may be made without changing essential features of the present invention. Therefore, the exemplary embodiments of the present invention are provided for illustrative purposes only but not intended to limit the technical concept of the present invention. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus comprising:
   a display panel;
   a light guide panel having a surface facing the display panel;
   a cover bottom coupled to the light guide panel; and
   a light source device at a side of the light guide panel, at least two surfaces of the light source device in contact with the cover bottom, the light source device for providing back light to the display panel, comprising:
      a mounting board comprising:
         a top surface at a first side of the mounting board,
         a bottom surface at a second side of the mounting board, the bottom surface in direct contact with the cover bottom,
         electrical lines on the top surface, and
         a plurality of walls on the first side of the mounting board, the plurality of walls and at least a portion of the top surface defining a groove at the first side of the mounting board, a top surface of the walls in direct contact with a side surface of the light guide panel, wherein the top surface of the walls is facing a same direction as the top surface of the mounting board; and
      one or more light source modules disposed on the top surface of the mounting board inside the groove of the mounting board and configured to receive power via the electrical lines, a thickness of the light source modules smaller than a depth of the groove,
   wherein the cover bottom includes an extension portion extending in a direction in which one surface of the light source device contacts the cover bottom, and a guide panel is fastened to the cover bottom while surrounding the extended portion.

2. The display apparatus of claim 1, wherein the mounting board further comprises:
   a metal body; and
   an insulating layer disposed on the metal body, the electrical lines are disposed on the insulating layer.

3. The display apparatus of claim 2, wherein the metal body is formed of one or more of aluminum, silicon steel, galvanized steel, copper alloy, or nickel.

4. The display apparatus of claim 2, wherein the insulating layer is formed of epoxy.

5. The display apparatus of claim 1, wherein one or more of the plurality of walls are in contact with a lateral surface of the light guide panel.

6. The display apparatus of claim 1, further comprising:
   an optical path changing structure configured to reflect light received from the light source device toward a lateral surface of the light guide panel.

7. The display apparatus of claim 1, wherein the optical path changing structure is one of a flat mirror, a curved mirror, or a lens.

8. The display apparatus of claim 1, wherein the light source device is formed by:
   pressing the mounting board to form the groove in the mounting board, the mounting board including a metal body, an insulating layer disposed on the metal body, and the electrical lines on the insulating layer; and
   placing one or more light source modules within the groove.

9. The display apparatus of claim 1, wherein each of the light source modules comprises a light source chip directly connected to the electrical lines of the mounting board.

10. The display apparatus of claim 1, wherein a lower surface of the light source chip is in contact with a conducting wire formed on the mounting board.

11. The display apparatus of claim 1, wherein the light source device is coupled to the light guide panel.

12. The display apparatus of claim 1, wherein the light source chip is disposed on a first surface of the mounting board, and further comprising a reflective layer disposed on the first surface of the mounting board.

13. A light source device of a display apparatus, comprising:
   a mounting board configured to mount onto a bottom cover of the display apparatus, the mounting board comprising:
      a bottom portion, the bottom portion having a top surface,
      electrical lines on the top surface of the bottom portion of the mounting board, and
      a plurality of walls defining a groove indented inwards at the side, wherein the plurality of walls are integral to the mounting board, the bottom portion of the mounting board and the walls being of a same material, a top surface of the walls in direct contact with a side surface of a light guide panel; and
   one or more light source modules disposed on the top surface of the bottom portion of the mounting board inside the groove of the mounting board, the one or more light sources configured to receive power via the electrical lines and provide backlight for the LCD device, a height of the one or more light source modules being shorter than a depth of the groove,
   wherein the light source device is at a side of the light guide panel, at least two surfaces of the light source device in contact with the bottom cover, and
   wherein the bottom cover includes an extension portion extending in a direction in which one surface of the light source device contacts the bottom cover, and a guide panel is fastened to the bottom cover while surrounding the extension portion.

14. The light source device of claim 13, wherein the mounting board further comprises:
   a metal body; and
   an insulating layer disposed on the metal body, the electrical lines disposed on the insulating layer.

15. The light source device of claim 14, wherein the metal body is formed of one or more of aluminum, silicon steel, galvanized steel, copper alloy, or nickel.

16. The light source device of claim 14, wherein the insulating layer is formed of epoxy.

17. The light source device of claim 13, wherein the one or more light source modules comprises:
   a light source chip for generating light in response to an electrical signal being applied to the light source chip; and
   a phosphor layer disposed on the light source chip, the phosphor layer for converting light generated by the light source into a white light.

18. The light source device of claim 17, wherein the light source chip is disposed on a first surface of the mounting board.

19. The light source device of claim 18, further comprising a reflective layer disposed on the first surface of the mounting board.

20. The light source device of claim 18, wherein lateral surfaces of the plurality of walls are slanted with respect to the first surface of the mounting board.

21. The light source device of claim 17, wherein the light source chip is directly connected to the electrical lines of the mounting board.

22. A back light unit comprising:
   a cover bottom;
   a light guide panel coupled to the cover bottom; and
   a light source device coupled to the cover bottom, comprising:
      a mounting board comprising:
         a bottom portion having a top surface
         electrical lines on the top surface of the bottom portion of the mounting board, and
         a plurality of walls defining a groove indented inwards at the side of the mounting board, wherein the plurality of walls are integral to the mounting board, the bottom portion of the mounting board and the walls being of a same material, a top surface of the walls in direct contact with a side surface of the light guide panel; and
   one or more light source modules disposed on the top surface of the bottom portion of the mounting board inside the groove of the mounting board and configured to receive power via the electrical lines, heights of the light source modules shorter than a depth of the groove,
   wherein the light source device is at a side of a light guide panel, at least two surfaces of the light source device in contact with the cover bottom, and
   wherein the cover bottom includes an extension portion extending in a direction in which one surface of the light source device contacts the cover bottom, and a guide panel is fastened to the cover bottom while surrounding the extended portion.

* * * * *